United States Patent
Dong

(10) Patent No.: US 7,719,441 B1
(45) Date of Patent: May 18, 2010

(54) SYSTEM AND METHOD FOR TRANSFERRING BIT-ORIENTED DATA OVER AN ACARS CHARACTER-ORIENTED DATA LINK

(75) Inventor: Xian Qin Dong, Beijing (CN)

(73) Assignee: Honeywell International Inc., Morristown, NJ (US)

( * ) Notice: Subject to any disclaimer, the term of this patent is extended or adjusted under 35 U.S.C. 154(b) by 6 days.

(21) Appl. No.: 12/348,441

(22) Filed: Jan. 5, 2009

(51) Int. Cl.
*H03M 7/00* (2006.01)
(52) U.S. Cl. .......................................... 341/50; 341/51
(58) Field of Classification Search .............. 341/50–51
See application file for complete search history.

(56) References Cited

U.S. PATENT DOCUMENTS

| | | | |
|---|---|---|---|
| 6,529,706 B1 * | 3/2003 | Mitchell | 455/12.1 |
| 6,657,565 B2 * | 12/2003 | Kampf | 341/51 |
| 6,677,888 B2 | 1/2004 | Roy | |
| 6,999,082 B2 | 2/2006 | Nishimura | |
| 7,215,264 B2 | 5/2007 | Salwan et al. | |
| 7,327,293 B2 | 2/2008 | Foster | |
| 7,504,970 B2 * | 3/2009 | Fulcomer | 341/51 |
| 2006/0080451 A1 | 4/2006 | Eckert | |
| 2008/0082694 A1 | 4/2008 | Labbe et al. | |

OTHER PUBLICATIONS

Elz, "RFC1924—A Compact Representation of IPv6 Addresses", Apr. 1, 1996, pp. 6, Publisher: http://tools.ietf.org.
Josefsson, "RFC4648—The Base16, Base32, and Base64 Data Encodings", Oct. 2006, pp. 18, Publisher: http://tools.ietf.org.
Josefsson, "RFC3548—The Base16, Base32, and Base64 Data Encodings", Jul. 2003, pp. 13, Publisher: http://tools.ietf.org.

* cited by examiner

*Primary Examiner*—Khai M Nguyen
(74) *Attorney, Agent, or Firm*—Fogg & Powers LLC

(57) ABSTRACT

A method of communicating bit-oriented data over an Aircraft Communications Addressing and Reporting System (ACARS) character-oriented data link comprises splitting the bit-oriented data into a plurality of segments; calculating a plurality of intermediate values corresponding to each segment; mapping each intermediate value to an ACARS character; and transmitting the ACARS characters over the ACARS data link.

18 Claims, 5 Drawing Sheets

| Intermediates value | Safe ISO #5 Character |
|---|---|
| 0 | 0 |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 10 | A |
| 11 | B |
| 12 | C |
| 13 | D |
| 14 | E |
| 15 | F |
| 16 | G |
| 17 | H |
| 18 | I |
| 19 | J |
| 20 | K |
| 21 | L |
| 22 | M |
| 23 | N |
| 24 | O |
| 25 | P |
| 26 | Q |
| 27 | R |
| 28 | S |
| 29 | T |
| 30 | U |
| 31 | V |
| 32 | W |
| 33 | X |
| 34 | Y |
| 35 | Z |
| 36 | ; |
| 37 | - |
| 38 | , |
| 39 | / |
| 40 | . |
| Start of data | Line feed (LF) |
| End of data | Carriage return (CR) |
| Zero segment | Space (SP) |

| Bit-Oriented data (Hex) | C2 | 47 | 07 | 74 | 08 | 53 | 00 | 0E | 0F | FB | 00 | 07 | 00 | 00 | 00 | 00 | 0A | 07 | 72 |
|---|---|---|---|---|---|---|---|---|---|---|---|---|---|---|---|---|---|---|---|
| Sending Characters | T02 | | 15M | | 1A: | | 00E | | 2HW | | 007 | (SPACE) | (SPACE) | | | 00A | | 15K |

| Bit-Oriented data (Hex) | C2 | 47 | 07 | 74 | 08 | 53 | 00 | 0E | 0F | FB | 00 | 07 | 00 | 00 | 00 | 00 | 0A | 72 |
|---|---|---|---|---|---|---|---|---|---|---|---|---|---|---|---|---|---|---|
| Sending Characters | T02 | | 15M | | 1A: | | 00E | | 2HW | | 007 | (SPACE) | (SPACE) | | | 00A | 2W |

302-1 {304, 304} ... 302-N {304, 304, 303}

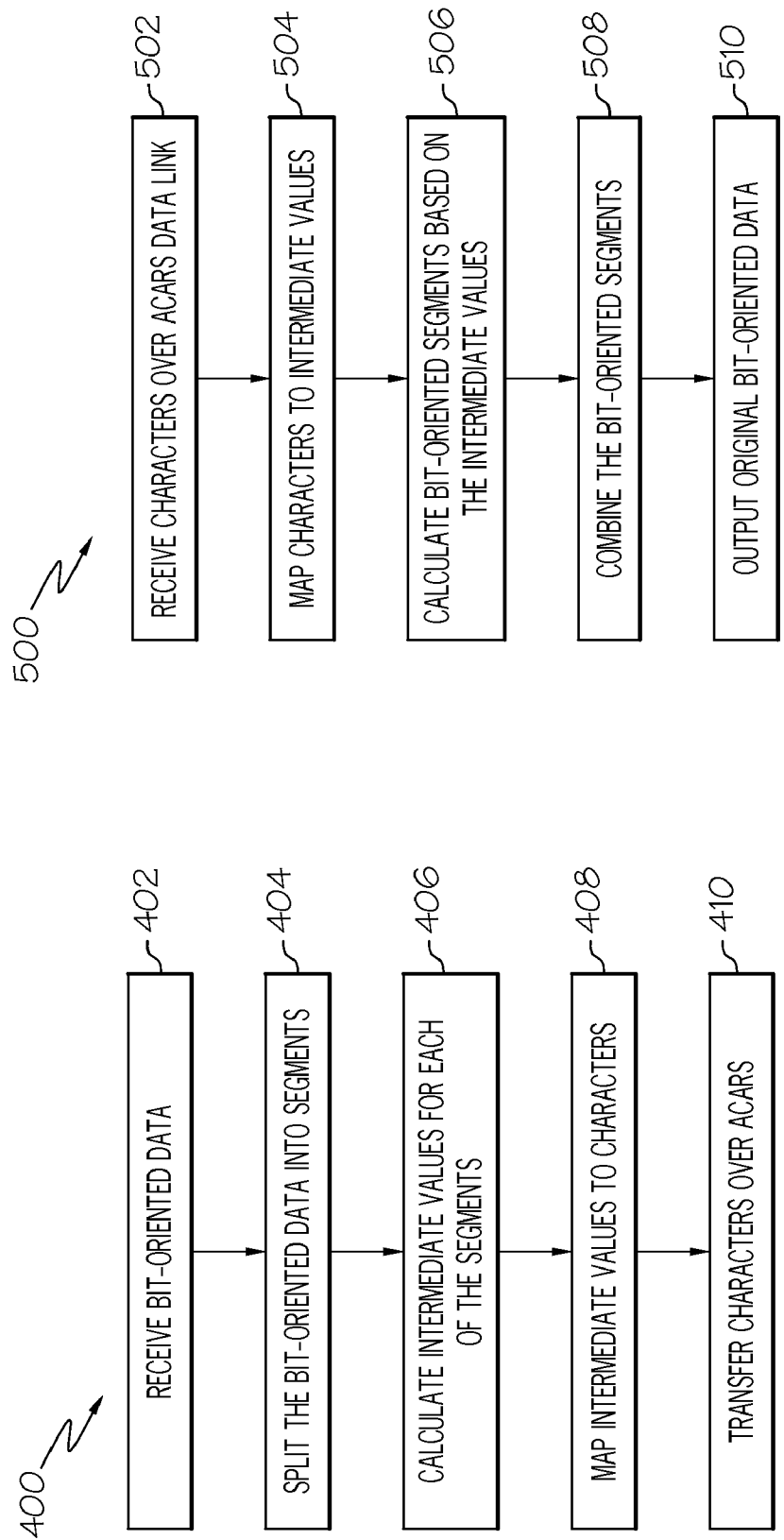

SYSTEM AND METHOD FOR TRANSFERRING BIT-ORIENTED DATA OVER AN ACARS CHARACTER-ORIENTED DATA LINK

BACKGROUND

Character-oriented protocols (also known as byte-oriented protocols) group information or control codes into full bytes (8 bits). One exemplary character-oriented protocol is the American Standard Code for Information Interchange (ASCII) character encoding. An ASCII character set defines characters in terms of byte information. For example, the byte "0100 0001" represents the character "A". Various communication systems use character-oriented protocols. One exemplary system which uses a character-oriented protocol is the Aircraft Communications Addressing and Reporting System (ACARS) used in aircraft air-to-ground communications. In ACARS, a set of ASCII characters can be transmitted over the system as defined in the Aeronautical Radio, Incorporated (ARINC) 618-6 Air/Ground Character-Oriented Protocol Specification.

In contrast to character-oriented protocols, bit-oriented protocols use a stream of individual bits to transfer information or control codes without grouping the bits into bytes. Bit-oriented protocols are typically less overhead-intensive than character-oriented protocols. Due to the lower overhead and/or other factors, many systems use bit-oriented protocols. For example, many line replaceable units (LRUs) used in an aircraft system communicate with one another using a bit-oriented protocol. In order for binary data from a bit-oriented protocol to be transferred over a character-oriented protocol, such as ACARS, a protocol conversion is needed. Conventional techniques for converting from a bit-oriented to a character-oriented protocol double the size of transmission data. In particular, the techniques described in the ARINC 622-4 ATS Data Link Applications over ACARS Air-Ground Network specification convert every 4 bits of the bit-oriented data to an 8 bit (1 byte) character. Although enabling the transmission of bit-oriented data over a character-oriented protocol, the increase in file size also increases the transmission time and the cost associated with ACARS transmissions since airlines typically pay for transmission of data over ACARS according to the number of bits sent.

SUMMARY

In one embodiment, a method of communicating bit-oriented data over an Aircraft Communications Addressing and Reporting System (ACARS) character-oriented data link is provided. The method comprises splitting the bit-oriented data into a plurality of segments; calculating a plurality of intermediate values corresponding to each segment; mapping each intermediate value to an ACARS character; and transmitting the ACARS characters over the ACARS data link.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 2 is one embodiment of a table for mapping intermediate values to characters.

FIGS. 3A-3B are exemplary diagrams showing one embodiment of a relationship between bit-oriented data and transmitted characters.

FIG. 4 is a flow chart depicting one embodiment of a method of transmitting bit-oriented data over a character-oriented data link.

FIG. 5 is a flow chart depicting one embodiment of a method of receiving bit-oriented data over a character-oriented data link.

In accordance with common practice, the various described features are not drawn to scale but are drawn to emphasize specific features relevant to the exemplary embodiments. Like reference numbers and designations in the various drawings indicate like elements.

DETAILED DESCRIPTION

Figure 1:
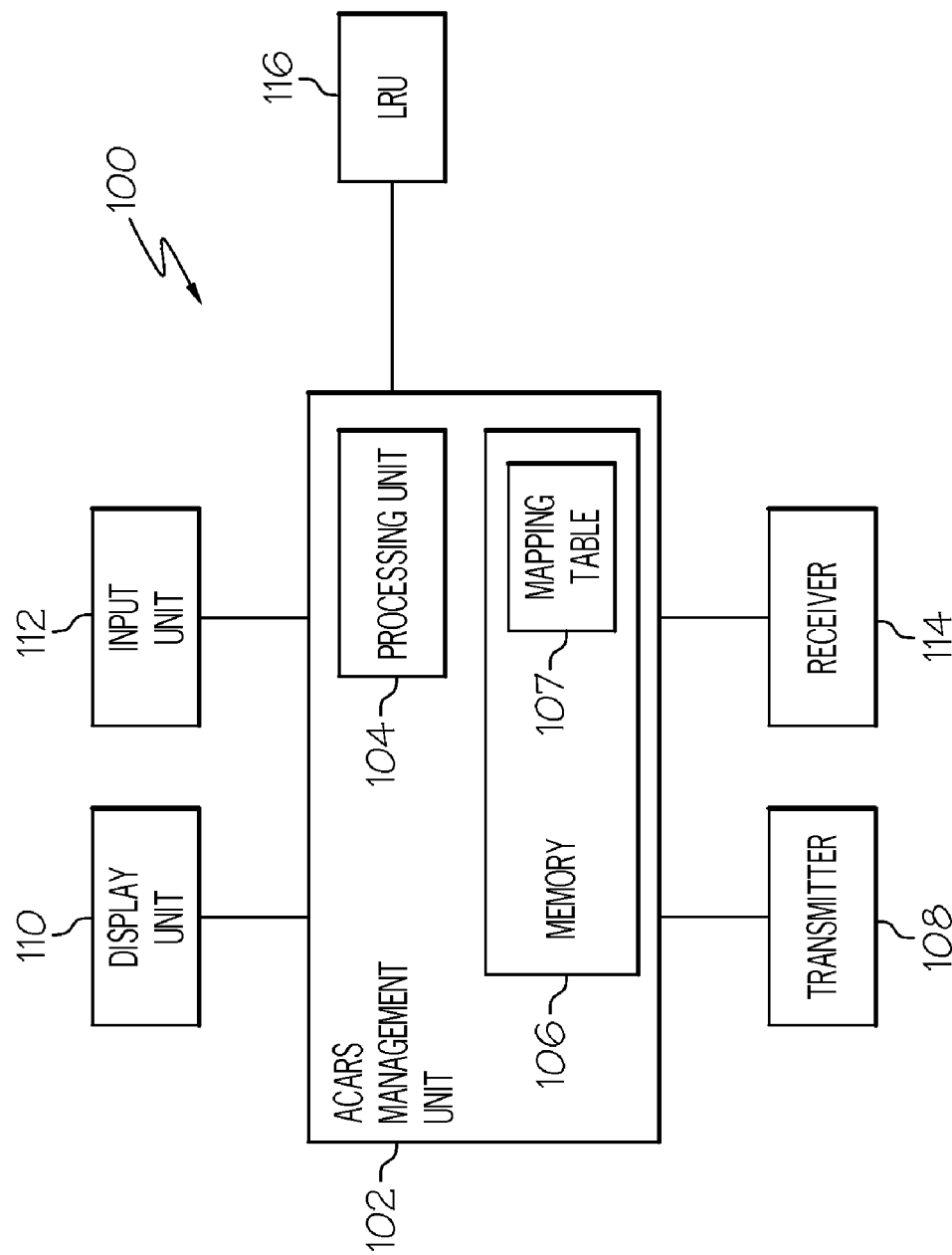
FIG. 1 is a block diagram of one embodiment of a communication system.

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures or the specification is not to be construed as limiting the order in which the individual steps may be performed. The following detailed description is, therefore, not to be taken in a limiting sense.

FIG. 1 is a block diagram of one embodiment of a communication system 100. Communication system 100 is implemented, in this exemplary embodiment, in an aircraft as part of an ACARS system, such as ACARS system 600 in FIG. 6. System 100 includes a transmitter 108 for transmitting data over an ACARS data link and a receiver 114 for receiving data over an ACARS data link. Although transmitter 108 and receiver 114 are shown as separate devices in FIG. 1, in some implementations, the receiver and transmitter are integrated into a single device (sometimes referred to as a "transceiver"). System 100 also includes management unit 102 which is comprised of a processing unit 104 and a memory 106. Notably, although management unit 102 includes memory 106 in the exemplary embodiment shown in FIG. 1, it is to be understood that memory 106 can be separate from management unit 102 in other embodiments.

Memory 106 can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

Additionally, processing unit 104 can be implemented using software, firmware, hardware, or any appropriate combination thereof, as known to one of skill in the art. For example, processing unit 104 can include or interface with hardware components and circuitry that support the conversion of bit-oriented data for transmission over a character-oriented data link. By way of example and not by way of limitation, these hardware components can include one or more microprocessors, memory elements, digital signal processing (DSP) elements, interface cards, and other standard components known in the art. Any of the foregoing may be supplemented by, or incorporated in, specially-designed application-specific integrated circuits (ASIC) and field programmable gate arrays (FPGA).

In one implementation of the embodiment shown in FIG. 1, at least a portion of processing unit 104 in management unit 102 is implemented in software that executes on a suitable programmable processor. Such software comprises a plurality of program instructions tangibly embodied on a processor-readable medium. For example, such a programmable processor can be implemented using a digital signal processor (DSP) that executes software that implements at least a portion of the functionality described herein as being performed by processing unit 104. In other examples, the programmable processor is a part of another type of programmable device such as an ASIC or FPGA.

Management unit 102 is coupled to at least one other device, such as a display unit 110, an input unit 112, and/or an LRU 116. LRU 116 can include, but is not limited to, sensors, actuators, compute nodes, etc. For example, LRU 116 can be implemented as a flight management computer (FMC) and/or a Flight Data Acquisition & Management System (FDAMS), etc. Display unit 110 displays data for a user, such as a pilot. Input unit 112 provides commands from the user in operation of the aircraft. In this embodiment, the data communicated between management unit 102 and at least one of display unit 110, input unit 112, and LRU 116 is bit-oriented data. As used herein, the term "bit-oriented data" refers to data formatted according to a bit-oriented protocol. The term "bit-oriented protocol", as used herein, refers to a protocol that uses a stream of individual bits to transfer information or control codes without restricting the bits to pre-defined groups of full bytes. Additionally, as used herein, the term "character-oriented protocol" refers to a protocol that groups information or control codes into full bytes, where each group of bits is a character from a pre-defined list of valid characters. Accordingly, as used herein, the term "character-oriented data link" refers to a data link over which data formatted according to a character-oriented protocol is transmitted. In other words, characters (pre-defined groups of bits into full bytes) are transmitted over a character-oriented data link.

Processing unit 104 converts the bit-oriented data for transmission over the character-oriented data link. In particular, processing unit 104 splits the bit-oriented data into a plurality of equal sized segments. For example, in this embodiment, processing unit 104 splits the bit-oriented data into two-byte (16-bit) segments. For each segment, processing unit 104 calculates a plurality of intermediate values. In particular, in this example, processing unit 104 calculates the intermediate values using the following equation:

$$\text{Segment} = v1*41^2 + v2*41 + v3$$

In the above equation, Segment represents the value of the segment (e.g. the decimal value represented by the 16 bits in the two-byte segment of this example). The variables v1, v2, and v3 each represent one of the intermediate values. Processing unit 104 then maps each of the intermediate values to a valid character. In particular, processing unit 104 uses a mapping table 107 stored in memory 106. Mapping table 107 maps the intermediate values to valid characters. The ARINC 618-6 Air/Ground Character-Oriented Protocol Specification defines 44 characters that can be safely transmitted over ACARS. In this example, system 100 uses 41 of the safe characters for mapping the intermediate values. FIG. 2 depicts an exemplary mapping table 207 showing mappings between intermediate values and the safe characters. It is to be understood that table 207 in FIG. 2 is provided by way of example, and not by way of limitation. In particular, other mappings between intermediate values and characters are used in other embodiments.

The remaining 3 characters of the safe characters are reserved for other uses in this exemplary embodiment. In particular, one character is reserved to mark the beginning of a message and another is reserved to mark the end of a message. For example, an ACARS message is limited to 3520 characters maximum. Thus, if the converted bit-oriented data has more than 3520 characters, the data can not be sent in one message. Hence, there is a need to split the data into multiple messages. The start of a message is marked, in this embodiment, using the reserved character "LF" (ASCII value: 0x0A) and the end of the message is marked using the reserved character "CR" (ASCII value: 0x0D) as shown in FIG. 2.

The last reserved character shown in table 207 is the space ("SP"). This character is reserved for the special case when the value of a segment is 0. In that case, the intermediate values v1, v2, and v3 are each equal to 0 and are each mapped to the single reserved character "SP". Due to the relatively high frequency of the segment value being 0, compared to other values, sending only one reserved character rather than three characters for the segment further reduces the size of the message.

FIG. 3A is an exemplary diagram showing the relationship between bit-oriented data and the sent characters in this embodiment. Notably, the bit-oriented data is represented in hexadecimal format in FIG. 3A. The bit-oriented data is divided into a plurality of segments 302-1 . . . 302-N. Each segment 302 is made up of two bytes 304 in this example. For example, the segment 302-1 contains the hexadecimal value C247 which is equivalent to the decimal value 49735. Each segment in FIGS. 3A and 3B are presented in Big-Endian byte order (i.e. the most significant byte saved first). However, it is to be understood that, in other embodiments, the data can be saved in Little-Endian byte order (i.e. the least significant byte saved first).

Using the decimal value 49735 in the equation above produces the intermediate values v1=29, v2=24, and v3=2. Processing unit 104 uses table 107 stored in memory 106 to map the three intermediate values to the characters T, O, and 2. The characters sent over the character-oriented ACARS by transmitter 108 are, therefore, TO2, as shown in FIG. 3A. Hence, as compared to simply sending the hexadecimal equivalent "C247", system 100 reduces the size of the message by at least 25% due to the reduction from 4 characters to 3 characters. The message size is further reduced by sending only one reserved character (space in this example) for zero segments, as shown in FIG. 3A. As used herein, a "zero segment" is defined as a segment with the value of 0.

If the bit-oriented data has an odd number of bytes, such that one segment has only one byte, processing unit 104 adds an empty byte to the segment having only one byte. An empty byte, as used herein, is a byte in which each bit has the value of 0. In this embodiment, processing unit 104 adds the empty byte as the first byte in the two-byte segment. For example, in FIG. 3B, the bit-oriented data is divided into a plurality of segments 302 that each have 2 bytes and one segment 303 that has only one byte. The hexadecimal value of segment 303 is "72". To calculate the intermediate values, processing unit 104 adds the hexadecimal value "00" to the first byte of the segment to obtain the value "0072". Processing unit 104 then calculates the three intermediate values using the segment value of "0072". However, only two of the intermediate values are mapped to characters in order to identify this segment as originally having only one byte. In particular, the intermediate values v2 and v3 are used in this example. Thus, only two characters are transmitted for segment 303.

When a message is received via receiver 114, processing unit 104 groups the received characters into groups of 302. Processing unit 104 maps each group's characters to an intermediate value using table 107 stored in memory 106, such as table 207 shown in FIG. 2. Notably, as used herein, a "table" is any data structure for storing data such as, but not limited to, a keyed relational database, a linked list, a flat-file record, etc. Processing unit 104 then uses the intermediate values to calculate the original bit-oriented data. Management unit 102 then outputs the bit-oriented data to the destination device, e.g. display unit 110 or LRU 116.

If, after grouping the segments into groups of 3 characters, a segment remains which has only two characters, as shown in FIG. 3B, processing unit 104 maps the two received characters to the intermediate values v2 and v3. The intermediate value v1 is always equal to "0" in this circumstance since the first byte in the segment is "00". Processing unit 104 then calculates the two-byte segment value using the mapped values for intermediate values v2 and v3, and "0" for the intermediate value v1. The first byte "00" is removed by processing unit 104 prior to sending the original bit-oriented data to the destination device.

Figure 6:
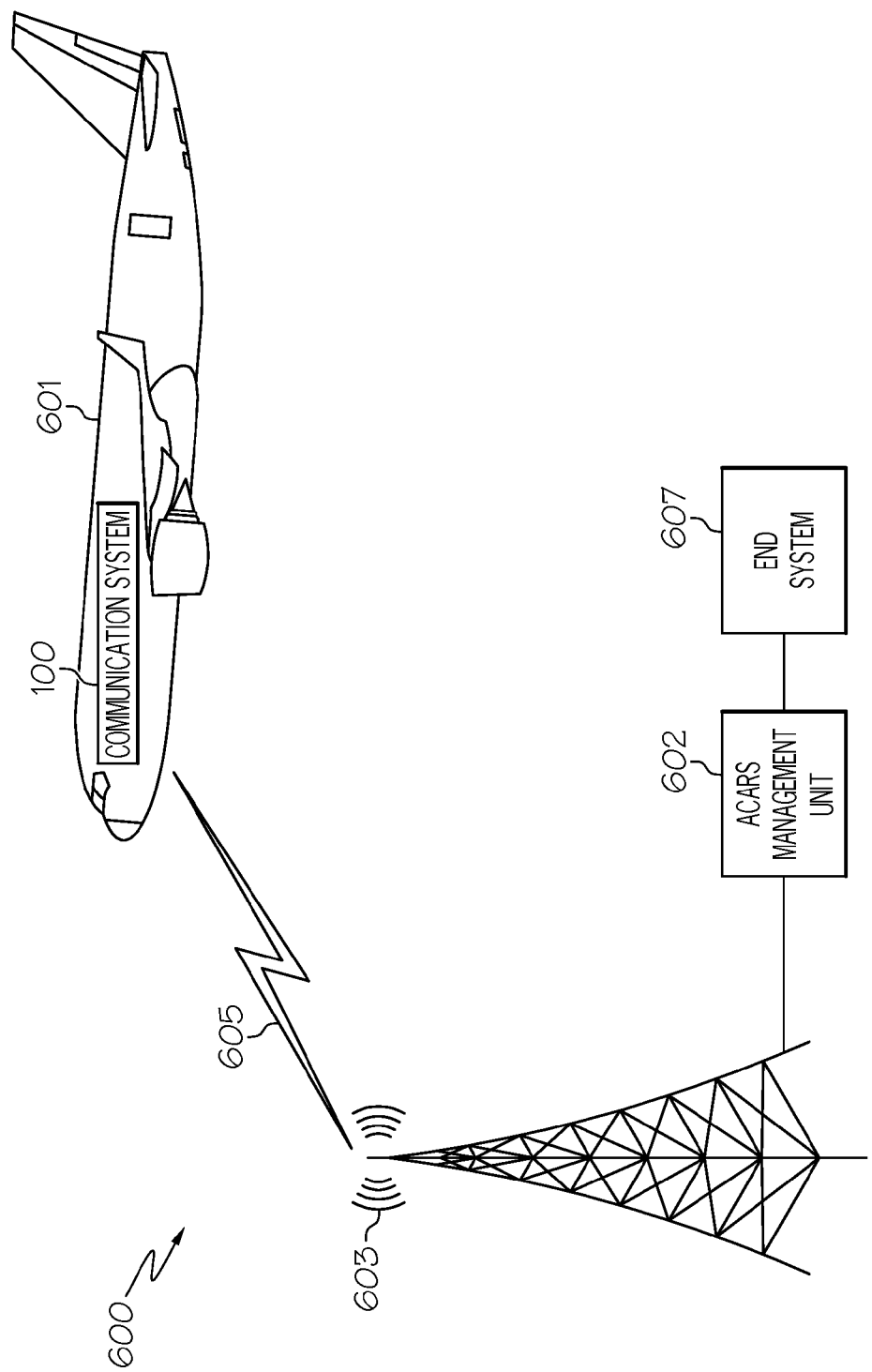
FIG. 6 is a block diagram of one embodiment of a communication network.

As stated above, in this embodiment, communication system 100 is implemented in an aircraft, such as aircraft 601 in FIG. 6, as part of an ACARS system 600. ACARS system 600 also includes ground station 603, a management unit 602, and end system 607. Management unit 602 implements the conversion functionality of processing unit 104 described above in order to convert between bit-oriented data and character-oriented data. End system 607 is coupled to management unit 602 to process the bit-oriented data received over the character-oriented data link 605. For example, end system 607 can include, but is not limited to, flight operations computers, maintenance computers, passenger service computers, etc. Although, this exemplary embodiment is described in terms of an aircraft air-to-ground network using wireless radio frequency (RF) data link 605, other embodiments are implemented in systems using other wireless (e.g. infrared) and/or wired data links to communicate bit-oriented data over a character-oriented data link. In addition, although management units 102 and 602 are labeled as ACARS management units, it is to be understood that, in other embodiments, management units 102 and 602 can be implemented as a communications management unit (CMU) or an Air Traffic Services Unit (ATSU).

FIGS. 4 and 5 describe methods for communicating bit-oriented data over a character-oriented data link. In particular, FIG. 4 is a flow chart depicting a method 400 of transmitting bit-oriented data over a character-oriented data link while FIG. 5 is a flow chart depicting a method of receiving bit-oriented data over the character-oriented data link. Methods 400 and 500 are implemented in a system such as system 100 above.

With respect to FIG. 4, bit-oriented data is received by management unit 102 from another device, such as input unit 112, at block 402. Method 400 continues at block 404 where processing unit 104 splits the received bit-oriented data into a plurality of segments. In particular, in this embodiment, processing unit 104 splits the bit-oriented data into two-byte segments, as described above. At block 406, processing unit 104 calculates a plurality of intermediate values for each of the segments. For example, in this embodiment, processing unit 104 uses the equation described above to calculate 3 intermediate values for each segment. Processing unit 104 then maps, at block 408, each of the calculated intermediate values to a character using table 107 stored in memory 106, as described above. The mapped characters are then transmitted over a character-oriented data link, such as ACARS, by transmitter 108 at block 410.

With respect to method 500 of receiving the bit-oriented data, mapped characters are received by receiver 114 at block 502. At block 504, each of the received characters is mapped to an intermediate value by processing unit 104 as described above. At block 506, processing unit 104 calculates the bit-oriented data based on the intermediate values. In particular, processing unit 104 groups the intermediate values into groups of 3 and calculates each of a plurality of segments of the bit-oriented data based on a group of 3 intermediate values, as described above. At block 508, processing unit 104 combines the segments to form the original bit-oriented data. At block 510, processing unit 104 sends the bit-oriented data to another system device, such as display unit 110 or LRU 116.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method of communicating bit-oriented data over an Aircraft Communications Addressing and Reporting System (ACARS) character-oriented data link, the method comprising:
   splitting the bit-oriented data into a plurality of segments;
   calculating a plurality of intermediate values corresponding to each segment;
   mapping each intermediate value to an ACARS character; and
   transmitting the ACARS characters over the ACARS data link.

2. The method of claim 1 wherein splitting the bit-oriented data into a plurality of segments comprises splitting the bit-oriented data into a plurality of two-byte segments.

3. The method of claim 2, wherein calculating a plurality of intermediate values for each segment comprises calculating three intermediate values.

4. The method of claim 2, wherein dividing the bit-oriented data into a plurality of segments comprises:
   adding an empty byte to a segment having only one byte of bit-oriented data.

5. The method of claim 4, wherein mapping each intermediate value to an ACARS character for the segment having the empty byte comprises:
   selecting two of three intermediate values; and
   mapping each of the two selected intermediate values to an ACARS character.

6. The method of claim 1, wherein mapping each intermediate value to an ACARS character comprises mapping the intermediate values for a zero segment to a single reserved character.

7. The method of claim 1, further comprising:
   receiving an ACARS character-oriented message;
   mapping each ACARS character in the received ACARS character-oriented message to an intermediate value; and calculating a plurality of bit-oriented data segments, each bit-oriented data segment calculated based on a plurality of the intermediate values.

8. An Aircraft Communications Addressing and Reporting System (ACARS) communication system comprising:
- a memory to store data for mapping intermediate values to characters;
- a processing unit to split a received bit-oriented message into a plurality of segments and to calculate a plurality of intermediate values for each of the plurality of segments;
- wherein the processing unit maps each of the intermediate values to a corresponding character using the data in the memory; and
- a transmitter to transmit the corresponding characters.

9. The ACARS communication system of claim 8, wherein the processing unit is operable to split the bit-oriented data into a plurality of two-byte segments.

10. The ACARS communication system of claim 9, wherein the processing unit is operable to calculate three intermediate values for each segment.

11. The ACARS communication system of claim 8, wherein the processing unit is operable to add an empty byte to a segment having only one byte of bit-oriented data.

12. The ACARS communication system of claim 11, wherein the processing unit is operable to select two of three intermediate values corresponding to the segment having the empty byte and to map each of the two selected intermediate values to a character.

13. The ACARS communication system of claim 8, further comprising:
- a receiver to receive character-oriented message data;
- wherein the processor is operable to map each received character to an intermediate value, and to calculate a plurality of bit-oriented data segments, each bit-oriented data segment calculated based on a plurality of intermediate values; and
- wherein the processor is further operable to combine the plurality of bit-oriented data segments for transmission to another device.

14. A program product comprising a processor-readable medium on which program instructions are embodied, wherein the program instructions are operable, when executed by at least one programmable processor, to cause the programmable processor to:
- split the bit-oriented data into a plurality of segments;
- calculate a plurality of intermediate values corresponding to each segment; and
- map each intermediate value to an Aircraft Communications Addressing and Reporting System (ACARS) character for transmission over an ACARS character-oriented link.

15. The program product of claim 14, wherein the program instructions are further operable to cause the programmable processor to split the bit-oriented data into a plurality of two-byte segments and to calculate three intermediate values for each two-byte segment.

16. The program product of claim 15, wherein the program instructions are further operable to cause the programmable processor to:
- add an empty byte to a segment having only one byte of bit-oriented data;
- select two of the three intermediate values corresponding to the segment having the empty byte; and
- map each of the two selected intermediate values to an ACARS character.

17. The program product of claim 14, wherein the program instructions are further operable to cause the programmable processor to map the intermediate values for a zero segment to a single reserved character.

18. The program product of claim 14, wherein the program instructions are further operable to cause the programmable processor to:
- map each ACARS character in a received ACARS character-oriented message to an intermediate value; and
- calculate each of a plurality of bit-oriented data segments based on a plurality of the intermediate values.

* * * * *